US008123514B2

(12) United States Patent
Sreenivasan et al.

(10) Patent No.: US 8,123,514 B2
(45) Date of Patent: *Feb. 28, 2012

(54) CONFORMING TEMPLATE FOR PATTERNING LIQUIDS DISPOSED ON SUBSTRATES (75) Inventors: Sidlgata V. Sreenivasan, Austin, TX (US); Byung-Jin Choi, Austin, TX (US); Ronald D. Voisin, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/717,664

(22) Filed: Mar. 4, 2010

(65) Prior Publication Data
US 2010/0173034 A1 Jul. 8, 2010

Related U.S. Application Data (63) Continuation of application No. 11/669,569, filed on Jan. 31, 2007, now Pat. No. 7,699,598.

(51) Int. Cl.
*B29C 59/02* (2006.01)
(52) U.S. Cl. ............... 425/385; 425/177; 977/887
(58) Field of Classification Search .......... 425/177, 425/385, 432, 810; 438/118; 977/887
See application file for complete search history.

(56) References Cited

U.S. PATENT DOCUMENTS

| 2,975,476 | A | * | 3/1961 | Burke ........................ 425/143 |
|---|---|---|---|---|
| 3,130,412 | A | * | 4/1964 | Fox et al. ................... 428/179 |
| 3,945,790 | A | * | 3/1976 | Puech ......................... 425/385 |
| 3,946,367 | A | * | 3/1976 | Wohlmut et al. .......... 369/44.13 |
| 4,312,823 | A | * | 1/1982 | Kraakman et al. .......... 264/107 |
| 4,329,308 | A | * | 5/1982 | Langer et al. ............... 264/162 |
| 4,395,211 | A | * | 7/1983 | Broeksema et al. ........ 425/174.4 |
| 4,514,249 | A | * | 4/1985 | Reed .......................... 156/553 |
| 4,601,861 | A | * | 7/1986 | Pricone et al. ............... 264/1.6 |
| 4,723,903 | A | * | 2/1988 | Okazaki et al. .............. 425/385 |
| 5,427,599 | A | * | 6/1995 | Greschner et al. ........... 65/305 |
| 5,669,303 | A | * | 9/1997 | Maracas et al. .............. 101/327 |
| 5,699,848 | A | * | 12/1997 | Lee et al. ..................... 164/46 |
| 5,804,017 | A | * | 9/1998 | Hector ......................... 156/242 |
| 6,270,611 | B1 | * | 8/2001 | Ohki et al. ................... 156/220 |
| 6,305,925 | B1 | * | 10/2001 | Cassani ....................... 425/405.1 |
| 6,335,775 | B1 | * | 1/2002 | Iwamura et al. ............. 349/125 |
| 6,482,742 | B1 | * | 11/2002 | Chou .......................... 438/690 |
| 2002/0159918 | A1 | * | 10/2002 | Tseng et al. .................. 422/100 |
| 2003/0099736 | A1 | * | 5/2003 | Anzai et al. ................. 425/174.4 |
| 2003/0189273 | A1 | * | 10/2003 | Olsson ........................ 264/293 |
| 2004/0219249 | A1 | * | 11/2004 | Chung et al. ................ 425/385 |
| 2006/0077374 | A1 | * | 4/2006 | Sreenivasan et al. ........ 355/72 |
| 2006/0172031 | A1 | * | 8/2006 | Babbs et al. ................ 425/385 |

OTHER PUBLICATIONS

Resnick et al., Imprint Lithography: Lab Curiosity or the Real NGL?, SPIE Microlithography Conference Feb. 1, 2003.*

* cited by examiner

*Primary Examiner* — Yogendra Gupta
*Assistant Examiner* — Emmanuel S Luk
(74) *Attorney, Agent, or Firm* — Cameron A. King (57) ABSTRACT

The present invention includes a template for patterning liquids disposed on a substrate. The template includes a body having opposed first and second surfaces with one surface having at least one recess and the other surface having a patterning region. In one embodiment, the template may be mounted to a fluid chamber having an inlet and a throughway. The template may be connected to the throughway and the inlet is connected to a fluid source.

20 Claims, 7 Drawing Sheets

CONFORMING TEMPLATE FOR PATTERNING LIQUIDS DISPOSED ON SUBSTRATES

CROSS-REFERENCE TO RELATED PATENT APPLICATIONS

The present application is a continuation of U.S. patent application Ser. No. 11/669,569 filed Jan. 21, 2007. U.S. patent application Ser. No. 11/669,569 is a continuation of U.S. patent application Ser. No. 10/614,716 filed Jul. 7, 2003 (now issued as U.S. Pat. No. 7,179,079), which itself claims priority from U.S. provisional patent application No. 60/394,458 filed Jul. 8, 2002. All of the aforementioned patent applications are incorporated herein by reference in their entirety.

BACKGROUND OF THE INVENTION

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication includes forming a relief image in a structure by depositing a polymerizable fluid composition onto a transfer layer. The transfer layer may be a sacrificial layer providing a mask for patterning the substrate or the substrate itself. A mold makes mechanical contact with the polymerizable fluid. The mold includes a relief structure, and the polymerizable fluid composition fills the relief structure. The polymerizable fluid composition is then subjected to conditions to solidify and polymerize the same, forming a solidified polymeric material on a transfer layer that contains a relief structure complimentary to that of the mold. The mold is then separated from the solid polymeric material such that a replica of the relief structure in the mold is formed in the solidified polymeric material. The solidified polymeric material is subjected to an environment to selectively etch the transfer layer relative to the solidified polymeric material such that a relief image is formed in the transfer layer. With this process, patterns with features on the scale of a few nanometers may be formed. As a result, substrates demonstrate extreme topologies when compared to the dimensions of features formed thereon may prevent accurate reproduction of the pattern in the solidified polymeric layer. Substrates formed from gallium arsenide (GAs) or indium phosphide (InP) have typically been found to demonstrate extreme topologies.

One manner in which to reduce, if not avoid, the effects of extreme topologies is demonstrated in U.S. Pat. No. 6,334,960 to Willson et al. Willson et al. disclose a method of forming a relief image in a structure that includes providing a substrate having a planarization layer. The planarization layer provides a substantially planar surface upon which a polymerizable fluid composition is deposited. Thereafter, a mold, having a relief structure, makes mechanical contact with the polymerizable fluid composition. The polymerizable fluid composition fills the relief structure. The polymerizable fluid composition is then subjected to conditions to solidify and polymerize the same, forming a solidified polymeric material on the planarization layer that contains a relief structure complimentary to that of the mold. The mold is then separated from the solid polymeric material such that a replica of the relief structure in the mold is formed in the solidified polymeric material. The planarization layer and the solidified polymeric material are subjected to an environment to selectively etch the planarization layer relative to the solidified polymeric material such that the relief image is transferred into the planarization layer.

It is desired, therefore, to provide improved techniques for pattern substrates having non-planar surfaces employing imprint lithography processes.

SUMMARY OF THE INVENTION

The present invention includes a conforming template for patterning liquids disposed on substrates. The template includes a body having opposed first and second surfaces. The first surface includes a plurality of recessed regions with a patterning region being disposed between adjacent recessed regions. Specifically, the recessed regions define flexure regions about which each patterning region may move independent of the remaining patterning regions of the template. In one embodiment the template is mounted to a fluid chamber having an inlet and a throughway. The template in connected to the throughway and the inlet is connected to a fluid source to facilitate deformation of the template to conform to a profile of a surface adjacent thereto. These and other embodiments are described herein.

DETAILED DESCRIPTION OF THE INVENTION

Figure 1:
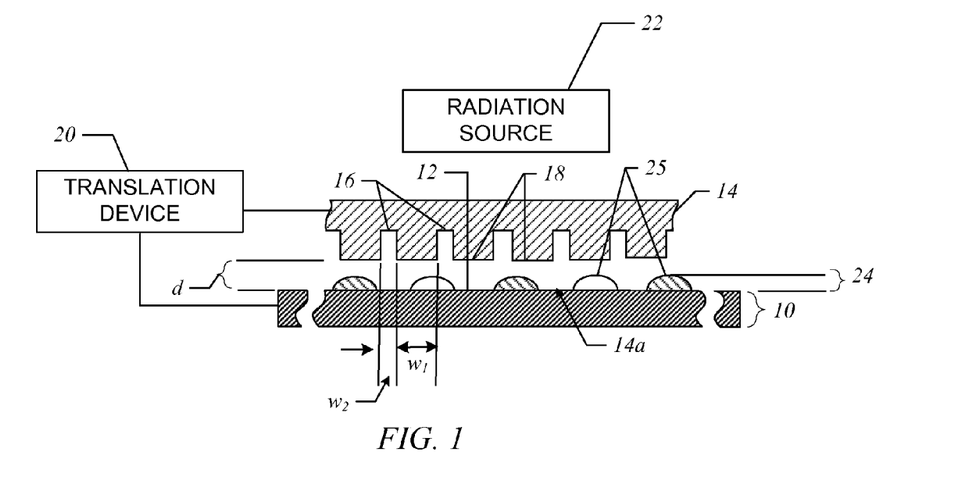
FIG. 1 is a simplified elevation view of a lithographic system in accordance with the present invention.

Referring to FIG. 1, a lithographic system in accordance with an embodiment of the present invention includes a substrate 10, having a substantially smooth and/or planar region, shown as surface 12. Disposed opposite substrate 10 is an imprint device 14 having a plurality of features thereon, forming a plurality of spaced-apart recessions 16 and protrusions 18. In the present embodiment, the recessions 16 are a plurality of grooves extending along a direction parallel to protrusions 18 that provide a cross-section of imprint device 14 with a shape of a battlement. However, the recessions 16 may correspond to virtually any feature required to create an integrated circuit. A translation device 20 is connected between imprint device 14 and substrate 10 to vary a distance "d" between imprint device 14 and substrate 10. An exemplary translation device is disclosed in U.S. Pat. No. 6,900,881 filed Jul. 11, 2002, entitled "Step and Repeat Imprint Lithography Systems", assigned to the assignee of the present invention, and which is incorporated by reference herein in its entirety. A radiation source 22 is located so that imprint device 14 is positioned between radiation source 22 and substrate 10. Radiation source 22 is configured to impinge radiation on substrate 10. To realize this, imprint device 14 is fabricated from material that allows it to be substantially transparent to the radiation produced by radiation source 22. Typically, imprint device 14 is a patterning region of a template 15 that typically extends from a surface thereof, forming a mesa of template 15, shown in FIG. 2.

Figure 3:
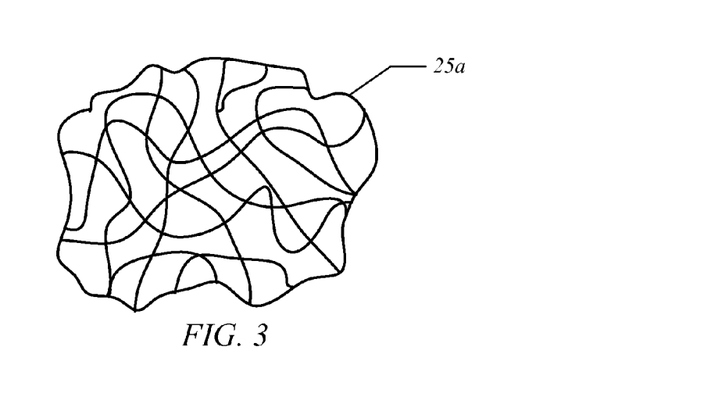
FIG. 3 is a simplified representation of material from which an imprinting layer, shown in FIG. 1, is comprised before being polymerized and cross-linked.

Referring to both FIGS. 1 and 3, an imprinting layer 24 is disposed adjacent to surface 12, between substrate 10 and imprint device 14. Although imprinting layer 24 may be deposited using any known technique, in the present embodiment, imprinting layer 24 is deposited as a plurality of spaced-apart discrete beads 25 of material 25a on substrate 10. An exemplary system for depositing material is disclosed in U.S. Pat. No. 6,926,929, filed Jul. 9, 2002, entitled "System and Method for Dispensing Liquids", which is assigned to the assignee of the present invention and incorporated by reference herein. Imprinting layer 24 is formed from a material 25a that may be selectively polymerized and cross-linked to record a desired pattern. Material 25a is shown in FIG. 4 as being cross-linked at points 25b, forming cross-linked polymer material 25c.

Figure 5:
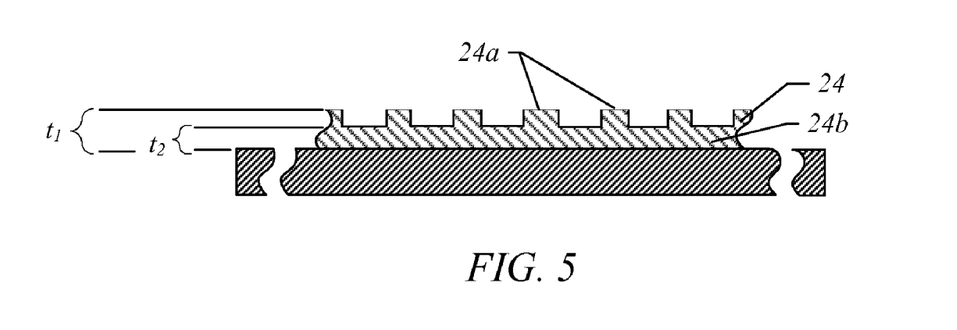
FIG. 5 is a simplified cross-sectional view of a substrate having an imprinted layer formed thereon with the imprint device, shown in FIG. 1.

Referring to both FIGS. 1 and 5, the pattern recorded by imprinting layer 24 is produced, in part, by mechanical contact with imprint device 14. To that end, translation mechanism 20 reduces the distance "d" to allow imprinting layer 24 to come into mechanical contact with imprint device 14, spreading beads 25 so as to form imprinting layer 24 with a contiguous formation of material 25a, shown in FIG. 3, over surface 12. In one embodiment, distance "d" is reduced to allow sub-portions 24a of imprinting layer 24 to ingress into and fill recessions 16.

Referring to FIGS. 1, 3 and 5, to facilitate filling of recessions 16, material 25a is provided with the requisite viscosity to completely fill recessions 16 in a timely manner, while covering surface with a contiguous formation of material 25a, on the order of a few milliseconds to a few seconds. In the present embodiment, sub-portions 24b of imprinting layer 24 in superimposition with protrusions 18 remain after the desired, usually minimum distance "d" has been reached, leaving sub-portions 24a with a thickness $t_1$, and sub-portions 24b with a thickness, $t_2$. Thicknesses "$t_1$" and "$t_2$" may be any thickness desired, dependent upon the application. Further, in another embodiment, sub-portions 24b may be abrogated entirely whereby the only remaining material from imprinting layer 24 are sub-portions 24a, after distance, "d" has reached a minimum value. This may occur, for example, when the height of the mesa $h_m$, is substantially greater than the depth, $d_r$, of the recessions 16.

Figure 4:
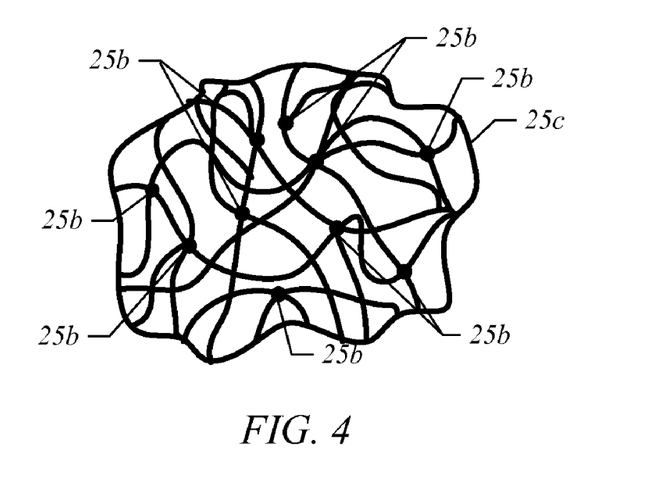
FIG. 4 is a simplified representation of cross-linked polymer material into which the material shown in FIG. 3 is transformed after being subjected to radiation.

Referring to FIGS. 1, 3 and 4, after a desired distance "d" has been reached, radiation source 22 produces actinic radiation that polymerizes and cross-links material 25a, forming cross-linked polymer material 25c. As a result, the composition of imprinting layer 24 transforms from material 25a to material 25c, which is a solid. Specifically, material 25c is solidified to provide surface 24c of imprinting layer 24 with a shape conforming to a shape of a surface 14a of imprint device 14, shown more clearly in FIG. 6.

Referring again to FIGS. 1, 3 and 4 an exemplary radiation source 22 may produce ultraviolet radiation. Other radiation sources may be employed, such as thermal, electromagnetic and the like. The selection of radiation employed to initiate the polymerization of the material in imprinting layer 24 is known to one skilled in the art and typically depends on the specific application which is desired. After imprinting layer 24 is transformed to consist of material 25c, translation mechanism 20 increases the distance "d" so that imprint device 14 and imprinting layer 24 are spaced-apart.

Figure 6:
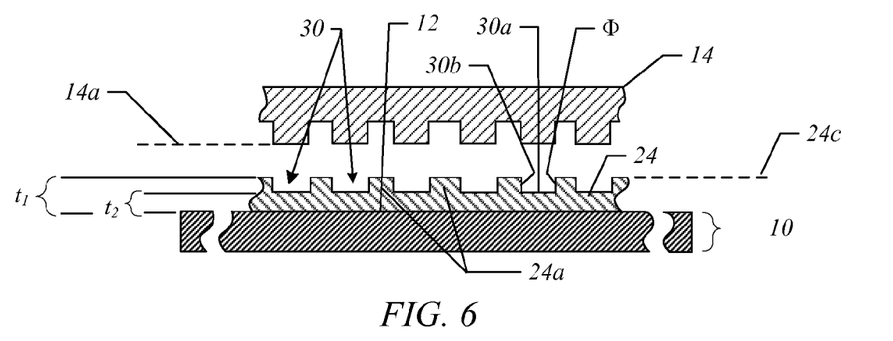
FIG. 6 is a simplified elevation cross-sectional view of the imprint device spaced-apart from the imprint layer, shown in FIG. 1, after patterning of an imprint layer on a substrate.

Referring to FIG. 6, additional processing may be employed to complete the patterning of substrate 10, for example, etching. To facilitate etching, the material from which imprinting layer 24 is formed may be varied to define a relative etch rate with respect to substrate 10, as desired. The relative etch rate of imprinting layer 24 to substrate 10 may be in a range of about 1.5:1 to about 100:1. Alternatively, or in addition to, imprinting layer 24 may be provided with an etch differential with respect to photo-resist material (not shown) selectively disposed on surface 24c. The photo-resist material (not shown) may be provided to further pattern imprinting layer 24, using known techniques. Any etch process may be employed, dependent upon the etch rate desired and the underlying constituents that form substrate 10 and imprinting layer 24. Exemplary etch processes may include plasma etching, reactive ion etching and the like.

Referring to FIGS. 1 and 6, the aspect ratio of recesses 30 formed from the aforementioned patterning technique may be as great as 30:1. To that end, one embodiment of imprint device 14 has recessions 16 defining an aspect ratio in a range of 1:1 to 10:1. Specifically, protrusions 18 have a width $W_1$ in a range of about 10 nm to about 5000 μm, and recessions 16 have a width $W_2$ in a range of 10 nm to about 5000 μm. As a result, imprint device 14 may be formed from various conventional materials, such as, but not limited to quartz, fused-silica, silicon, organic polymers, siloxane polymers, borosilicate glass, fluorocarbon polymers, metal, silicon, silicon dioxide, silicon germanium carbon, gallium nitride, silicon germanium, sapphire, gallium arsenide, epitaxial silicon, poly-silicon, gate oxide, indium tin oxide, diamond, and combinations of the above. Features of imprint device 14 may be formed using any known technique, e.g., machined, wet etch, dry etch and the like.

Figure 7:
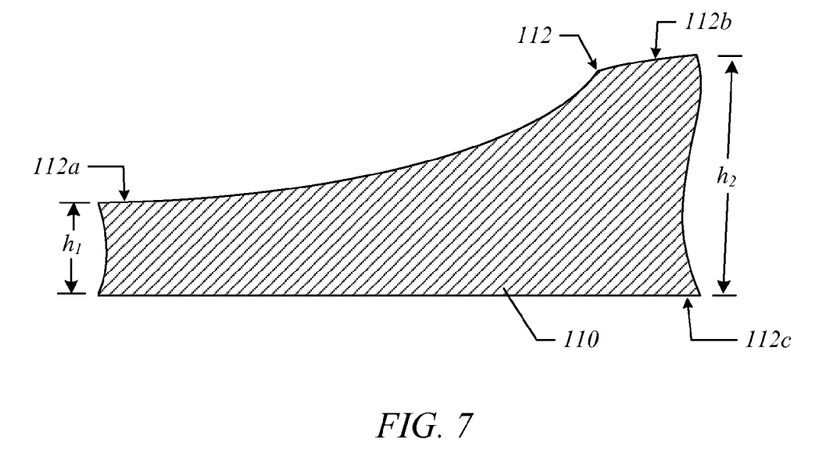
FIG. 7 is a detailed view demonstrating the non-planarity of the substrate in accordance with the prior art.

Referring to FIG. 7, a problem addressed by the present invention concerns formation of features on substrates having extreme topologies when compared to the dimensions of features formed thereon. As a result, substrate 110 appears to present a non-planar surface 112. This has been traditionally found in substrates formed from gallium arsenide (GAs) or indium phosphide (InP). However, as the feature dimensions decrease substrates that have historically been considered planar may present a non-planar surface to features formed thereon. For example, substrate 110 is shown with variations in surface height. The variation in height frustrates attempts to control the dimensions of features formed into substrate 110, because of the resulting differences in distances between surface regions 112a and 112b as measured from a backside 112c of substrate 112, as $h_1$ and $h_2$, respectively. The height differential, $\Delta h$, between regions 112a and 112b is defined as follows:

$$\Delta h = |h_1 - h_2| \quad (1)$$

Height differential, $\Delta h$, may be problematic during the imprinting process and/or one or more post imprinting process, e.g., etching.

Figure 8:
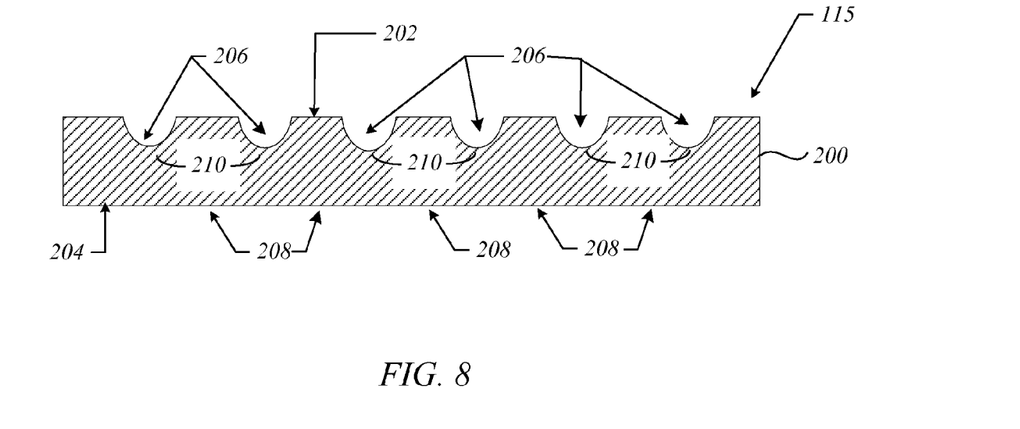
FIG. 8 is a simplified plan view of a template employed to pattern the substrate shown in FIG. 6 in accordance with the present invention.

Referring to FIGS. 1, 7 and 8, to overcome the problems resulting from height differential, $\Delta h$, imprint device 14 comprises of a conforming template 115 for patterning liquids, such as material 25a, shown in FIG. 3, disposed on substrate 110. Template 115 includes a body 200 having opposed first 202 and second 204 surfaces.

First surface 202 includes a plurality of recessed regions 206 with a patterning region 208 being disposed between adjacent recessed regions 206. Specifically, recessed regions 206 define flexure regions 210, about which each patterning region 208 may move independent of the remaining patterning regions 208 of template 115. As shown, patterning regions 208 are areas of surface 204 positioned between adjacent flexure regions 210.

Figure 9:
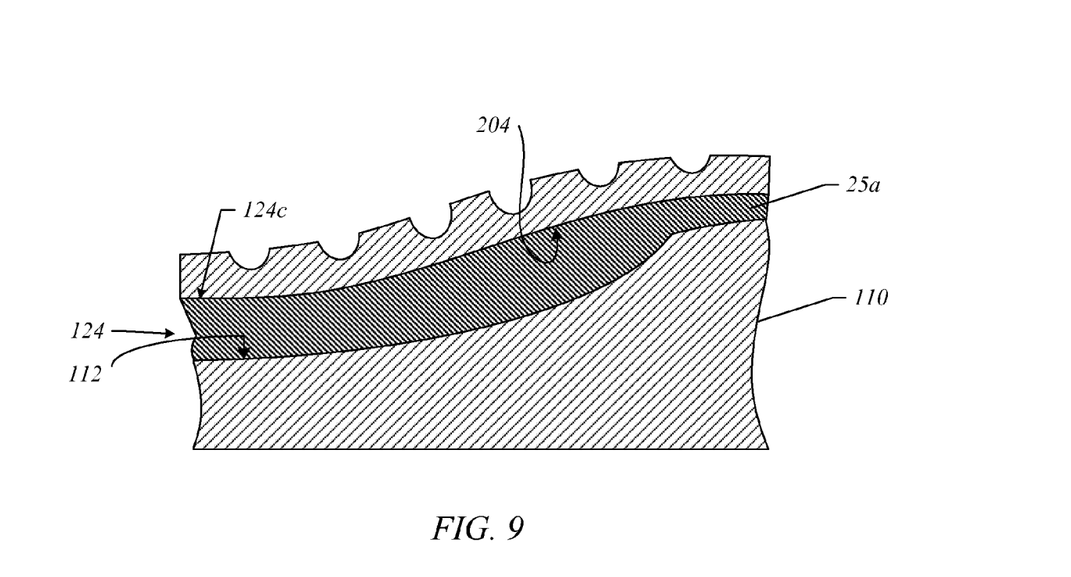
FIG. 9 is a simplified plan view showing the template, shown in FIG. 8, imprinting material disposed on the substrate, shown in FIG. 7.
Figure 10:
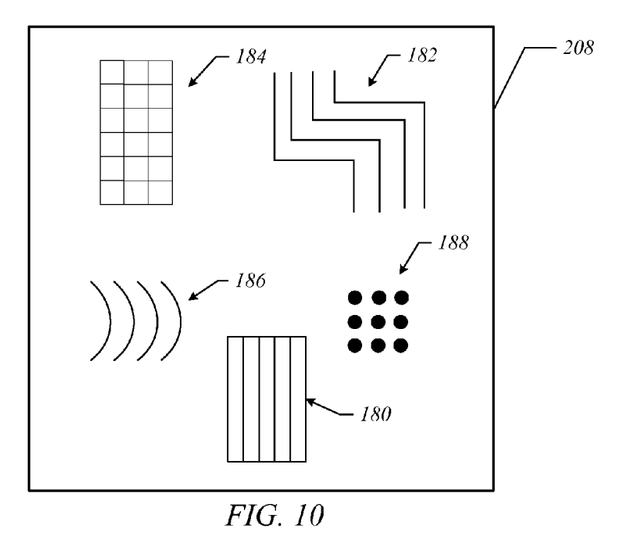
FIG. 10 is a simplified plan view showing the various patterns that may be included with the template shown in FIGS. 2 and 8, in accordance with the present invention.

Referring to both FIGS. 3, 8 and 9, during imprinting of material 25a contained in layer 124, template 115 compresses material 25a between surface 204 and surface 112. Recessed regions 206 allow flexing of body 200 about the plurality of flexure regions 210. In this manner, template 115 conforms to the profile of surface 112 defined, in part, by the height differential $\Delta h$. Material 25a may be disposed on surface 112 and solidified, as described above with respect to FIGS. 1-6. Advantages of conforming template 115 is that the same may be employed to create surface 124c of layer 124 with a substantially smooth profile in the presence of a substrate 110 having an extreme topology. Additionally, one or more of patterning regions 208, shown in FIG. 8, may be provided with recessions 16 and protrusions 18 to define imprint device 14, shown in FIG. 1. In this manner, layer 124, shown in FIG. 9 may be patterned with recession and protrusions (not shown). It should be noted that the pattern provided in patterning regions 208, shown in FIG. 8, and imprint device 14, shown in FIG. 1, may be any type of pattern, such as uniform periodic features having common shapes, as well as features having differing shapes. Further, recessions 16 and protrusions 18 may be arranged on patterning regions 208, shown in FIG. 8, to form virtually any desired geometric pattern. Exemplary patterns include a series of linear grooves/projections 180, a series of L-Shaped grooves/projections 182, a series of intersecting grooves/projections defining a matrix 184, and a series of arcuate grooves/projections 186, shown in FIG. 10. Additionally, pillars 188 may project from patterning region 208 and have any cross-sectional shape desired, e.g., circular, polygonal etc.

Figure 11:
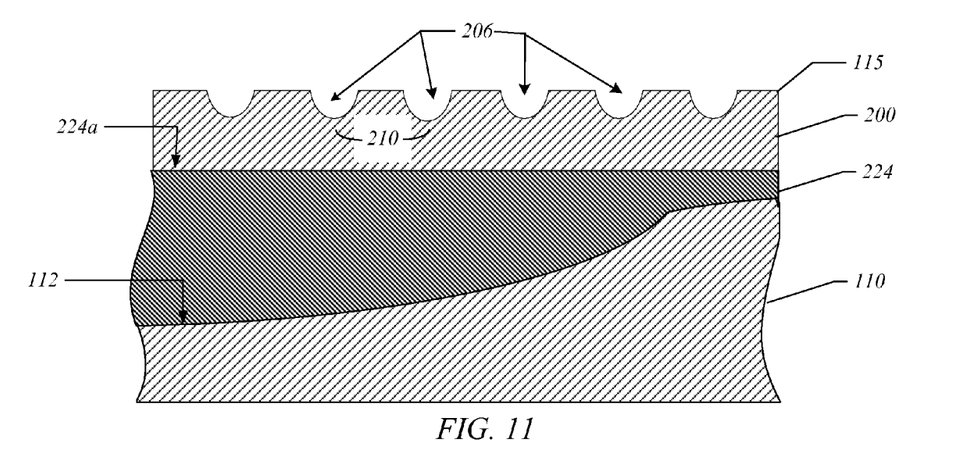
FIG. 11 is a simplified elevation view of material disposed on a template shown in FIG. 8, to planarize a substrate in accordance with one embodiment of the present invention.

Referring to FIGS. 3 and 11, template 115 may also be employed to form a surface 224a of layer 224 so as to be smooth and planar. The conformality of body 200 to the material 25a deposited on surface 112 is dependent upon many factors, such as the material 25a from which body 200 is formed and the size of recesses 206, as well as the volume distribution of material 25a deposited on surface 112 and the mechanical properties of the same. As a result, for a given body 200, the conformality of the same is dependent upon the quantity of material 25a and the mechanical properties of the material 25a, i.e., viscosity, density and the like. For a given volume of material 25a deposited on surface 112, the conformality of body 200 is dependent upon providing flexure regions 210 with a desired flexing motion. This may be achieved by the selection of material 25a from which body 200 is formed, as well as the dimensions of recesses 206 in body 200. To that end, imprint device 14, shown in FIG. 1, or template 115 may be formed from many differing materials, as discussed above with respect to imprint device 14.

Figure 12:
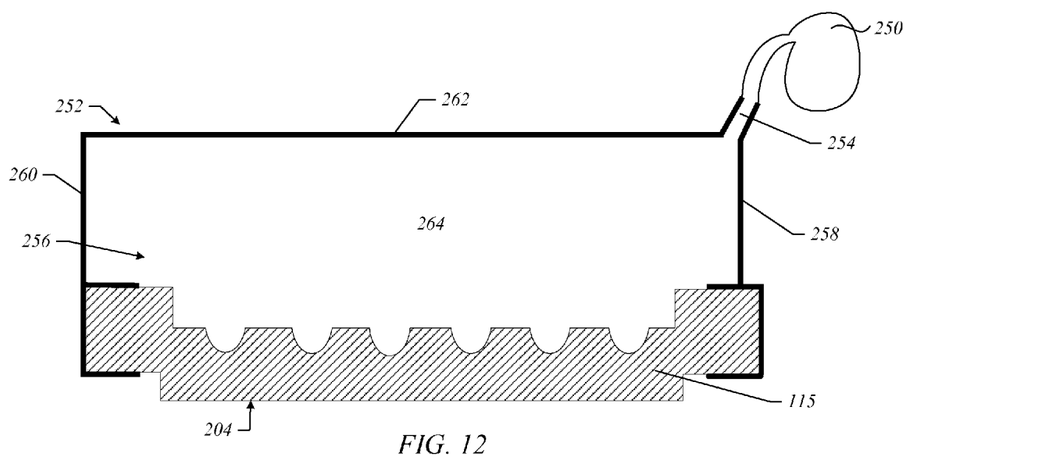
FIG. 12 is a simplified plan view showing the template coupled to a device to apply pressure to one side of the template, in accordance with an alternate embodiment of the present invention.

Referring to FIG. 12, to facilitate conforming template 115 to a surface, a fluid source, such as a pump 250 may be placed in fluid communication with first surface 202, shown in FIG. 8, to vary a pressure present. To that end, a fluid chamber 252 includes an inlet 254 and a throughway 256. Template 115 is mounted in throughway 256 to substantially restrict fluid flow therethrough. As a result template 115 and sides 258, 260 and 262 define a volume 264. Sides 258, 260 and 262 may be more rigid than template 115. In this fashion, template 115 may be more sensitive to variations in pressure changes occurring in volume 264 than sides 258, 260 and 262. As a result, pump 250 may pressurize or evacuate volume 264 as desired to vary a shape of template 115 to facilitate conformation of template 115 with a surface adjacent to second side 204.

Referring to FIGS. 1, 3 and 6, the characteristics of material 25a are important to efficiently pattern substrate 10 in light of the unique deposition process employed. As mentioned above, material 25a is deposited on substrate 10 as a plurality of discrete and spaced-apart beads 25. The combined volume of beads 25 is such that the material 25a is distributed appropriately over area of surface 12 where imprinting layer 24 is to be formed. As a result, imprinting layer 24 is spread and patterned concurrently, with the pattern being subsequently set by exposure to radiation, such as ultraviolet radiation. As a result of the deposition process it is desired that material 25a have certain characteristics to facilitate rapid and even spreading of material 25a in beads 25 over surface 12 so that the all thicknesses $t_1$ are substantially uniform and all thickness $t_2$ are substantially uniform. Exemplary materials are disclosed in U.S. Pat. No. 7,157,036 filed Jun. 17, 2003, entitled "Method to Reduce Adhesion Between a Conformable Region and a Pattern of a Mold", and which is incorporated by reference herein in its entirety.

Figure 13:
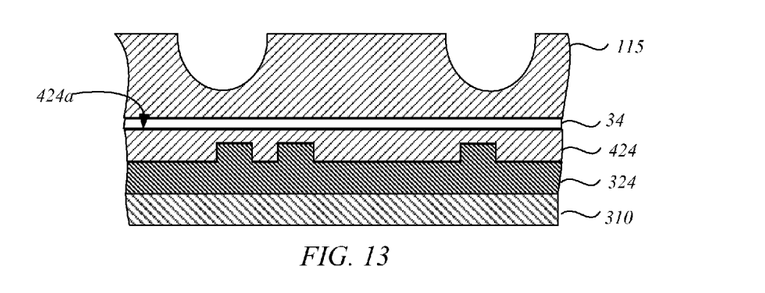
FIG. 13 is a cross-sectional view demonstrating formation of a planarization layer with the template shown in FIG. 8 in accordance with one embodiment of the present invention.
Figure 14:
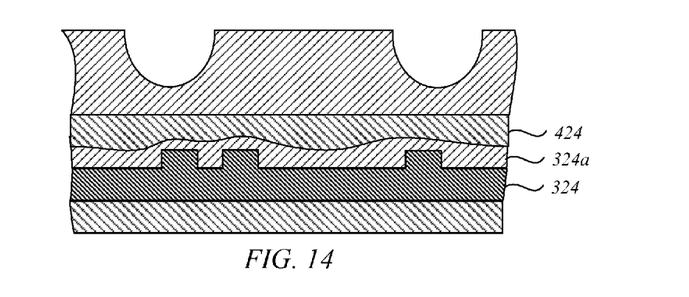
FIG. 14 is a cross-sectional view demonstrating formation of a planarization layer with the template shown in FIG. 8 in accordance with an alternate embodiment of the present invention.

Referring to FIGS. 8 and 13, employing template 115 for planarization facilitates imprint lithography on patterned layers. For example, assuming a patterned layer 324 is present on substrate 310, template 115 may be employed to create a planarization layer 424. Planarization layer 424 provides a smooth and/or planarized surface 424a upon which to form an additional patterned layer 324. To that end, planarization layer 424 may be disposed directly upon patterned layer 324 or on a spin-coated layer 324a that covers patterned layer 324, shown in FIG. 14. Planarization layer 424 may be formed from a number of differing materials, such as, for example, thermoset polymers, thermoplastic polymers, polyepoxies, polyamides, polyurethanes, polycarbonates, polyesters, and combinations thereof. It is desired that planarization layer 424 be formed from material that polymerizes, or cures, in response to the actinic radiation employed to cure imprinting layer 24, shown in FIG. 1, and adheres well thereto and other adjacent layers, such as patterned layer 324 shown in FIG. 14, as well as experience less than 15% shrinkage during curing. It is also desired that planarization layer 424 not substantially penetrate patterned layer 324. Specifically, it is desired that planarization layer 424 not be swelled by the imprinting layer 24 to the extent where there is more than 5% of imprinting material 25a, shown in FIG. 3, penetrating the planarization layer 424. Additionally, it is desired that the material 25a have a viscosity of less than 30 cps and more particularly less than 5 cps at 20° C. If spin-on processes are employed to apply planarization layer 424, the viscosity of the material 25a from which it is formed may be upwards of 100 cps.

A class of material that demonstrates desired characteristics is non-silicon-containing acrylates. An exemplary material is ethylene glycol diacrylate combined with an initiator and stabilizers for long shelf life. The initiator, may be any of those discussed above and is responsive to actinic radiation, such as UV light and causes a free radical which facilitates polymerization and cross-linking of the ethylene glycol acrylate. Typically, the initiator does not constitute more than 5% of the mixture. An exemplary initiator may consist of molecules selected from a set consisting of 1-hydroxycyclohexyl phenyl ketone, 2-(2-hydroxypropyl) phenyl ketone, available from Ciba Corporation under the trade name Darocur 1173 and phenylbis (2,4,6-trimethyl benzoyl) phosphine oxide.

Employing ethylene glycol diacrylate, planarization layer 424 is fabricated in a manner similar to imprinting layer 24, shown in FIG. 1, using a featureless template 115, shown in FIG. 8 with patterning regions 208 that are smooth and/or planar. In this manner, planarization layer 424 is fabricated to possess a continuous, smooth, relatively defect-free surface that may exhibit excellent adhesion to the patterned layer 324.

Referring to FIGS. 1, 8 and 13, to ensure that planarization layer 424 does not adhere to template 115 second surface 204 may be treated with a modifying agent. One such modifying agent is a release layer 34 formed from a fluorocarbon silylating agent. Release layer 34 and other surface modifying agents may be applied using any known process. For example, processing techniques that may include chemical vapor deposition method, physical vapor deposition, atomic layer deposition or various other techniques, brazing and the like.

Figure 2:
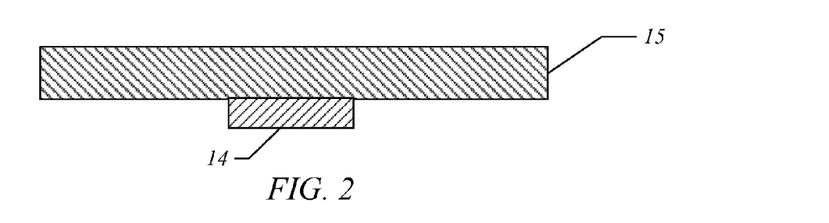
FIG. 2 is a simplified cross-sectional view of a template upon which an imprinting device, shown in FIG. 1, is formed.
Figure 15:
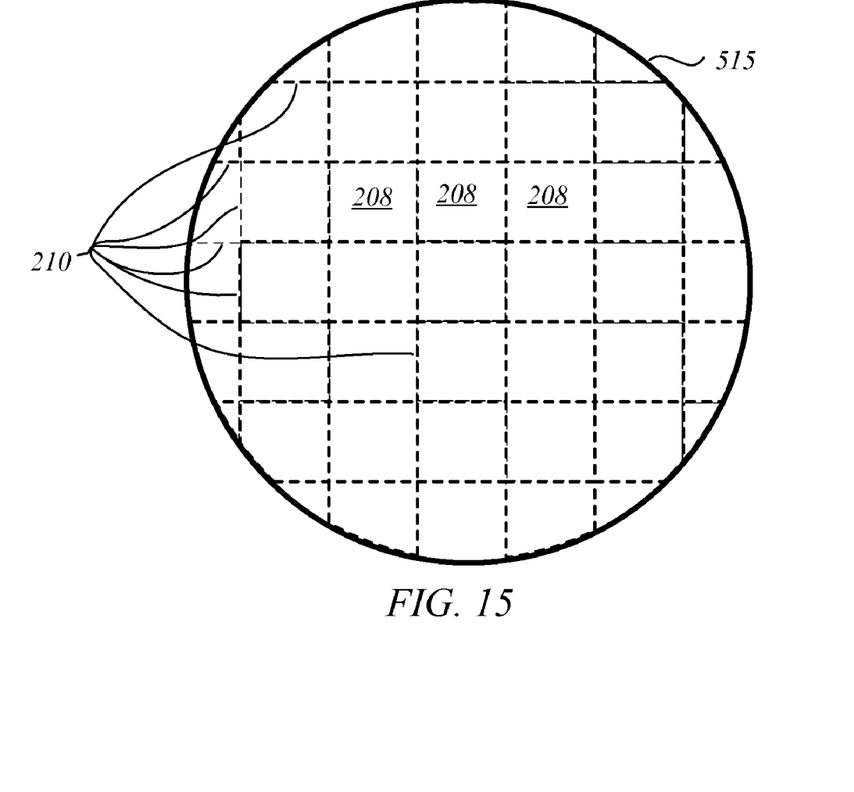
FIG. 15 is a top down view of the templates shown in FIGS. 2 and 8 in accordance with the present invention.
Figure 16:
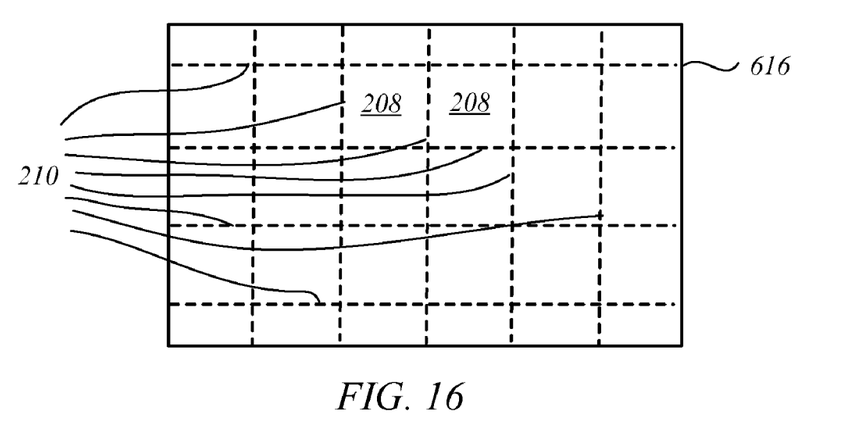
FIG. 16 is a top down view of the template shown in FIG. 15 in accordance with an alternate embodiment of the present invention.

Referring to FIGS. 2 and 8, it should be understood that template 15 and 115 may have any shape desire, such as the circular shape, shown with respect to substrate 515, shown in FIG. 15, or rectangular, shown in FIG. 16 as substrate 616 and may have one patterning region 208 or a plurality of patterning regions 208 arranged as an array, with flexure regions 210 surrounding patterning regions 208. Similarly, template 15, shown in FIG. 2 may have an array of imprinting devices 14, shown in FIG. 1, disposed thereon.

The embodiments of the present invention described above are exemplary. Many changes and modifications may be made to the disclosure recited above, while remaining within the scope of the invention. For example, any of the imprinting techniques mentioned above may be employed as whole field imprinting process of partial field and may incorporate step and repeat imprinting processes to that end. Additionally, many of the embodiments discussed above may be implemented in existing imprint lithography processes that do not employ formation of an imprinting layer by deposition of beads of polymerizable material. Exemplary processes in which differing embodiments of the present invention may be employed include a hot embossing process disclosed in U.S. Pat. No. 5,772,905, which is incorporated by reference in its entirety herein. Additionally, many of the embodiments of the present invention may be employed using a laser assisted direct imprinting (LADI) process of the type described by Chou et al. in *Ultrafast and Direct Imprint of Nanostructures in Silicon*, Nature, Col. 417, pp. 835-837, June 2002, which is incorporated by reference in its entirety herein; as well as traditional spin-on processes. Therefore, the scope of the invention should be determined not with reference to the above description, but instead should be determined with reference to the appended claims along with their full scope of equivalents.

What is claimed is:

1. A system comprising:
   a substrate having a plurality of droplets positioned thereon;
   a mold assembly, spaced-apart from the substrate, for imprinting a pattern in a deformable material, the mold assembly having first and second surfaces, with the first surface including at least one recessed region and the second surface defining a patterning region configured to provide the pattern in the deformable material;
   a mold deformation enabling apparatus coupled to the mold assembly to facilitate deformation of the mold assembly to conform to a layer formed from the plurality of droplets, wherein the mold deformation enabling apparatus includes a chamber having an inlet and a throughway, with the mold assembly being connected to the throughway; and,
   a source of fluid in fluid communication with chamber through the inlet, varying pressure at the recessed region.

2. The system as recited in claim 1, wherein the chamber includes a plurality of walls, with the plurality of walls being more rigid than the mold assembly.

3. The system as recited in claim 1, wherein the patterning region has a profile selected from a set of profiles including smooth, planar, and patterned.

4. The system as recited in claim 1, wherein the patterning region covers an area of the second surface that has a polygonal shape.

5. The system as recited in claim 1, further including a plurality of the patterning regions arranged in a two-dimensional array.

6. The system as recited in claim 1, wherein the pattern includes a plurality of protrusions and recessions having sub-micron dimensions.

7. A system comprising:
   a mold assembly for imprinting a pattern in a deformable material, the mold assembly having first and second surfaces, with the first surface including at least one recessed region and the second surface defining a patterning region configured to provide the pattern in the deformable material;
   a mold deformation enabling apparatus coupled to the mold assembly to facilitate deformation of the mold assembly to conform to a profile of a surface adjacent to the mold assembly, wherein the mold deformation enabling apparatus includes a chamber having an inlet and a throughway, with the mold assembly being connected to the throughway; and,
   a source of fluid in fluid communication with chamber through the inlet, varying pressure at the recessed region.

8. The system as recited in claim 7, wherein the surface further includes a plurality of spaced-apart droplets positioned thereon.

9. The system as recited in claim 7, wherein the chamber includes a plurality of walls.

10. The system as recited in claim 9, wherein the plurality of walls is more rigid than the mold assembly.

11. The system as recited in claim 7, wherein the patterning region is patterned.

12. The system as recited in claim 7, wherein the patterning region is planar.

13. The system as recited in claim 7, wherein a portion of the patterning region is patterned and a portion of the patterning region is planar.

14. The system as recited in claim 7, wherein the patterning region covers an area of the second surface that has a polygonal shape.

15. The system as recited in claim 7, further including a plurality of the patterning regions arranged in a two-dimensional array.

16. The system as recited in claim 7, wherein the pattern includes a plurality of protrusions and recessions.

17. The system as recited in claim 16, wherein the plurality of protrusions and recessions have submicron dimensions.

18. A system comprising:
a substrate having a plurality of droplets positioned thereon;
a mold assembly, spaced-apart from the substrate, for imprinting a pattern in a deformable material, the mold assembly having first and second surfaces, with the first surface including at least one recessed region and the second surface defining a patterning region configured to provide the pattern in the deformable material;
a chamber having an inlet and a throughway, with the template being connected to the throughway to facilitate deformation of the mold assembly to conform to a layer formed from the plurality of droplets;
a source of fluid in fluid communication with the chamber through the inlet, varying pressure at the recessed region; and
a source of radiation to impinge actinic radiation upon the layer.

19. The system as recited in claim 18, wherein the chamber includes a plurality of walls, with the plurality of walls being more rigid than the mold assembly.

20. The system as recited in claim 18, wherein the patterning region has a profile selected from a set of profiles including smooth, planar, and patterned.

* * * * *